United States Patent
Chang et al.

(10) Patent No.: US 10,038,254 B2
(45) Date of Patent: Jul. 31, 2018

(54) SYSTEMS, DEVICES AND METHODS OF USING A CONDUCTIVE HOUSING FOR A BATTERY CONTACT

(71) Applicant: Fossil Group, Inc., Richardson, TX (US)

(72) Inventors: Timothy Chang, San Jose, CA (US); Adam Mekeel Mack, Menlo Park, CA (US)

(73) Assignee: Fossil Group, Inc., Richardson, TX (US)

( * ) Notice: Subject to any disclaimer, the term of this patent is extended or adjusted under 35 U.S.C. 154(b) by 0 days.

(21) Appl. No.: 15/280,210

(22) Filed: Sep. 29, 2016

(65) Prior Publication Data
US 2017/0093053 A1    Mar. 30, 2017

Related U.S. Application Data

(60) Provisional application No. 62/235,467, filed on Sep. 30, 2015.

(51) Int. Cl.
*H01R 4/64* (2006.01)
*H05K 5/00* (2006.01)
*H01M 2/02* (2006.01)
*H01M 2/10* (2006.01)

(52) U.S. Cl.
CPC .......... *H01R 4/64* (2013.01); *H01M 2/0202* (2013.01); *H01M 2/1044* (2013.01); *H05K 5/0086* (2013.01)

(58) Field of Classification Search
CPC ................. H05K 5/0086; H01R 4/64
See application file for complete search history.

(56) References Cited

U.S. PATENT DOCUMENTS

| 7,118,817 | B2 | 10/2006 | Bartholf et al. |
| 8,822,049 | B2 | 9/2014 | Tanii et al. |
| 2004/0253867 | A1 | 12/2004 | Matsumoto |
| 2013/0114838 | A1 | 5/2013 | Berkmann et al. |
| 2015/0105221 | A1 | 4/2015 | Roush et al. |

OTHER PUBLICATIONS

WayBackMachine [online], Panasonic Lithium Coin Batteries Tech Specs Oct. 2, 2014 (Oct. 2, 2014) Retrieved from the Internet [Aug. 11, 2016] <http://lwww.microbattery.com/specs-panasonic-lithium-coin>.
International Search Report and Written Opinion for International Application No. PCT/US2016/054394, dated Dec. 12, 2016, 8 pages.

*Primary Examiner* — Briggitte R Hammond
(74) *Attorney, Agent, or Firm* — Cooley LLP

(57) ABSTRACT

A device includes a housing constructed from a conductive material, and an electronic circuit electrically insulated from the housing. The device also includes a power source positioned such that a first electrical contact of the power source faces the electronic circuit and a second electrical contact faces a side of the housing. The device also includes an insulating layer that includes a first aperture and a second aperture. The device also includes a first connector configured for electrically coupling the electronic circuit and the first electrical contact, and a second connector configured for electrically coupling the electronic circuit and the side of the housing via the first aperture of the insulating layer. The power source is configured for electrically coupling the second electrical contact with the side of the housing via the second aperture of the insulating layer.

18 Claims, 8 Drawing Sheets

SYSTEMS, DEVICES AND METHODS OF USING A CONDUCTIVE HOUSING FOR A BATTERY CONTACT

CROSS-REFERENCE TO RELATED APPLICATIONS

This application claims priority to and the benefit of U.S. Provisional Application No. 62/235,467, filed on Sep. 30, 2015, entitled, "SYSTEMS, DEVICES AND METHODS OF USING A CONDUCTIVE CASING FOR A BATTERY CONTACT," the disclosure of which is incorporated by reference herein in its entirety.

This application is also related to U.S. Provisional Application No. 62/235,526 entitled "METHODS AND APPARATUSES FOR SIMULATANEOUSLY EXCHANGING MESSAGES BETWEEN A LOW-ENERGY RADIO DEVICE AND MULTIPLE CENTRAL DEVICES", filed on Sep. 30, 2015; U.S. Provisional Application No. 62/235,469 entitled "SYSTEMS, DEVICES, AND METHODS OF MULTIPLEXED USE OF A CONDUCTIVE CASING", filed on Sep. 30, 2015; and to U.S. Provisional Application No. 62/235,472 entitled "SYSTEMS, DEVICES AND METHODS OF DETECTION OF USER INPUT", filed on Sep. 30, 2015.

BACKGROUND

Wearable devices can be generally characterized as body-worn and/or body-associated devices. With increasingly demanding processing requirements, wearable devices typically incorporate one or more processors, and associated computing abilities. At the same time, form factor plays a major role in wearable technology—not just for the processor, but also the entire system. Early adopters were able to employ chip-scale and wafer-based packaging. The use of multi-chip modules (MCMs) can achieve a small, thin form factor. Minimizing wiring requirements outside of the package also allows for easy integration onto miniature printed-circuit boards (PCBs).

PCBs and/or other electronic processing circuitry require power input. FIG. 1 illustrates an example wearable device 100 having a casing 110, a battery 120, and a PCB 130. For proper operation, the battery 120 must make contact with the PCB 130 via both its negative terminal (negative contacts 140A) and its positive terminal (positive contact 140B). The need for such contacts, however, increases the form factor for the wearable device 100. If the contacts are made smaller to avoid this issue, they are relatively more susceptible to breaking and result in contact failure.

There is hence an unmet need to provide improved electrical connectivity in wearable devices while maintaining and/or reducing form factor.

SUMMARY

Systems, devices and methods of using a conductive housing for a battery contact are described herein. In some embodiments, a device includes a housing constructed from a conductive material, an electronic circuit that is electrically insulated from the housing, and a power source. The power source is disposed between the electronic circuit and a side of the housing and is positioned such that a first electrical contact of the power source faces the electronic circuit and a second electrical contact of the power source faces the side of the housing. The device further includes an insulating layer formed on the side of the housing. The insulating layer including a first aperture and second aperture formed therein. The device also includes a first connector configured for electrically coupling the electronic circuit and the first electrical contact. The device also includes a second connector configured for electrically coupling the electronic circuit and the side of the housing via the first aperture of the insulating layer. The power source is configured for electrically coupling the second electrical contact with the side of the housing via the second aperture of the insulating layer, such that the second electrical contact is conductively coupled to the electronic circuit via the housing and the second connector.

In some embodiments, a method includes placing an electronic circuit in a housing. The electronic circuit is electrically insulated from the housing. The housing is constructed from a conductive material. The method further includes placing a power source disposed between the electronic circuit and a side of the housing. The power source is positioned such that a first electrical contact of the power source faces the electronic circuit and the second electrical contact of the power source faces the side of the housing. The method also includes electrically coupling the electronic circuit and the first electrical contact via a first connector. The method further includes electrically coupling via a second connector the electronic circuit and the side of the housing via a first aperture of an insulating layer on the side of the housing. The insulating layer includes a first aperture and a second aperture formed therein. The method also includes electrically coupling the second electrical contact with the side of the housing via the second aperture on the insulating layer. The second electrical contact is conductively coupled to the electronic circuit via the housing and the second connector. The entire surface area of the second electrical contact is in contact with the insulating layer.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Other systems, processes, and features will become apparent to those skilled in the art upon examination of the following drawings and detailed description. It is intended that all such additional systems, processes, and features be included within this description, be within the scope of the present invention, and be protected by the accompanying claims.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1:
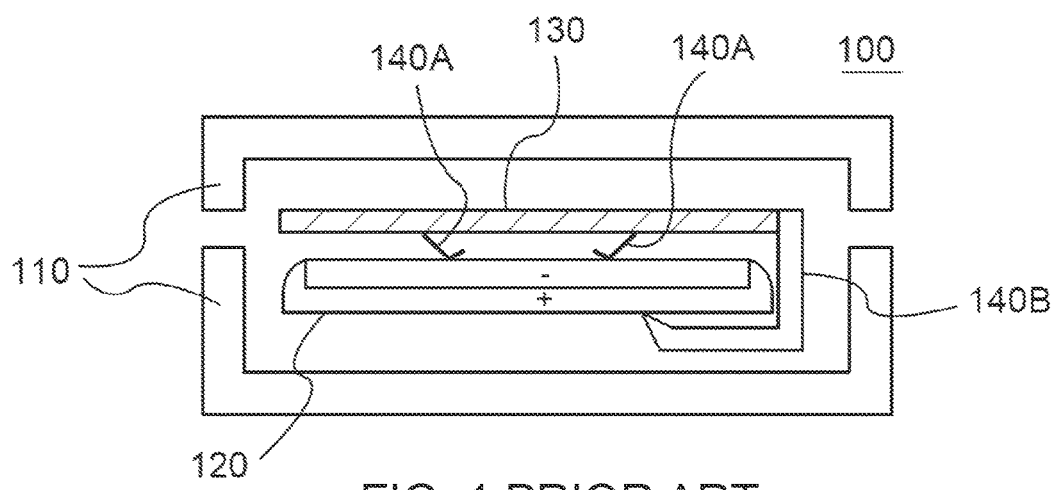
FIG. 1 is an illustration of electrical connectivity in a device, according to prior art.

The present disclosure describes systems, devices and methods for improving electrical connectivity in wearable devices while maintaining/reducing form factor. Embodiments described herein use a conductive housing as battery contacts. The conductive housing completes the electronic circuit and reduces form factor.

In some embodiments, a device (also referred to as a "wearable device", or a "personal fitness device") includes a cover, casing, housing, a shell, and/or the like ("housing" hereon), that covers at least a portion of the device. In some embodiments, the housing, or at least a portion thereof, is substantially electrically conductive in nature. The housing can be constructed of any suitable, electrically conductive material such as stainless steel, aluminum, copper, conductive polymers, composites that include conductive additives (e.g., graphene), conductor-coated glass (e.g., with indium-tin-oxide, similar to capacitive touch screens), combinations thereof, and/or the like. In some embodiments, the housing can be associated with an electrically conductive component. In some embodiments, the housing can be constructed from a single continuous conductive material. In other embodiments, the housing can be constructed from two or more conductive materials that are fused, linked, coupled, soldered and/or welded together.

In some embodiments, the device can also include one or more power sources. The one or more power sources of the device can include, but are not limited to, replaceable batteries such as button or coin cells, an integrated battery, a rechargeable battery (including an inductively-rechargeable battery), capacitors, super-capacitors, and/or the like. In some embodiments, the device can include a button cell, so as to be operable for several months without requiring replacement. In some embodiments, the device can include a power switch for powering the device on and off, while in other embodiments, the device does not have a power switch that can be manipulated by a user. In some embodiments, the device is a first device, and can be powered on/off by a second device.

In some embodiments, the device can also include one or more components consuming power from the power source. Non-limiting examples of such components (hereon, powered components) can include one or more processing components such as processors, electronic circuits such as printed circuit boards (PCBs), and/or the like; one or more input sensors or interfaces for receiving input from a user; fitness sensors for monitoring, tracking, and/or otherwise determining fitness parameters/data associated with a user; one or more storage media for storing the user input and/or the fitness data; one or more communication modules for wirelessly communicating and/or otherwise transferring the user input and/or the fitness data, or information associated therewith, such as to a second device, and/or the like.

In some embodiments, the powered components can be as generally described in U.S. patent application Ser. No. 14/881,677 ("the '677 application") titled "SYSTEMS, DEVICES, AND METHODS FOR DYNAMIC CONTROL", filed Oct. 13, 2015, the entire disclosure of which is incorporated herein by reference in its entirety. In some embodiments, the device is configured for proximity based data transfer of fitness data to another device, as disclosed in U.S. patent application Ser. No. 14/309,195 ("the '195 application") titled "SYSTEMS AND METHODS FOR DATA TRANSFER", filed Jun. 19, 2014, the entire disclosure of which is incorporated herein by reference in its entirety.

In some embodiments, the device includes one or more insulating layers between the housing and the battery. In some embodiments, the insulating layer is formed on one side of the housing and includes two or more apertures. In some embodiments, the one or more insulating layer can be anodized layers of metals such as aluminum. The two or more apertures enable conductive coupling of the PCB/electronic circuit (hereon "electronic circuit") and the housing and/or, the battery and the housing via one or more electric connectors.

In some embodiments, the device further includes one or more electrical interconnects/connectors between the power source and the powered component(s) (also sometimes referred to as an electronic circuit, for simplicity). In some embodiments, the device further includes one or more connectors between the housing and the powered component. In some embodiments, the device includes an insulating layer with one or more apertures that enable conductive coupling of the electronic circuit and the housing as well as the power source and the housing. In some embodiments, one or more connectors conductively couple the electronic circuit and a side of the housing via one or more apertures. Each connector can be independently formed, and include one or more conductive elements. For example, a connector between the power source and the powered component can include multiple conductive elements that are fused, linked, and/or otherwise in electrical communication with each other to provide a conduction path between the power source and the powered component. Non-limiting examples of connectors can include wires, pogo pins, pogo pin cables, jumpers, board-to-board connectors, circuit board connectors, Amp connectors, FFC (flexible flat cable) I FPC (flexible printed cable) board connectors, wire to board connectors, ribbon connectors, combinations thereof, and/or the like. In some embodiments, connectors are mounted onto the surface of the powered component/electronic circuit using surface-mount technology (SMT).

In some embodiments, the connectors are resilient connectors that are configured to hold the power source in a press fit against the insulating layer of housing during use. Additionally, resilient connectors can maintain conductive coupling between the electronic circuit and the housing that is in contact with the connector mounted on the electronic circuit. Non-limiting examples of resilient electrical connectors include spring clips, pogo pins, and/or the like.

The use of multiple connectors between the battery and the housing, and also the housing and the electronic circuit, ensure redundancy of connectivity, and reduce the likelihood of contact failure without increasing form factor.

Figure 2:
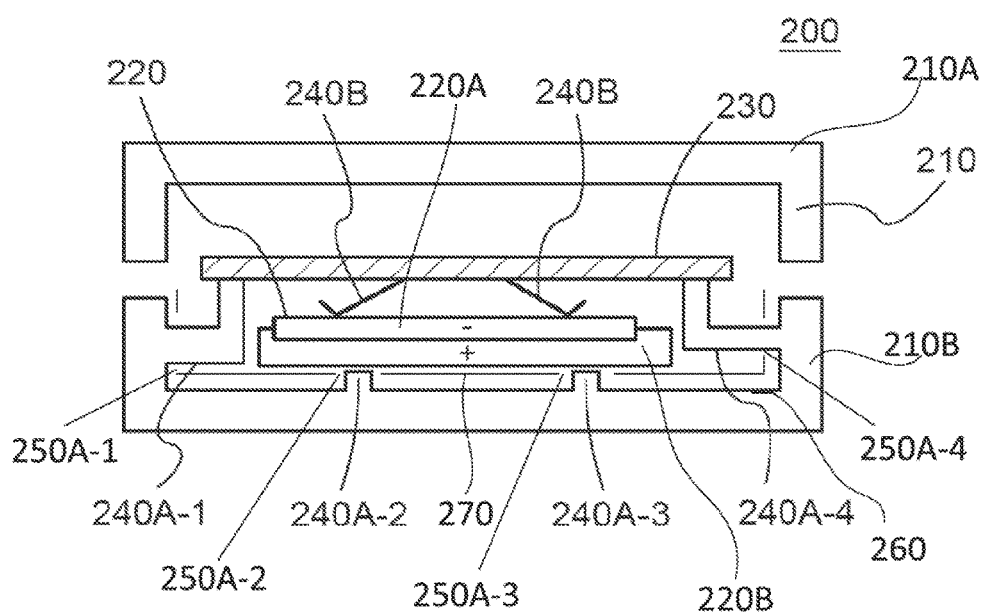
FIG. 2 illustrates electrical connectivity using the housing of a device, according to some embodiments.

FIG. 2 is a schematic illustration of a device 200, according to embodiments. The device 200 is operable for use by a user for collecting user-specific information, such as user input, fitness-related information, biometric information, and/or the like. In some embodiments, the device 200 can include a personal fitness device or activity tracker such as, but is not limited to, a pedometer, a physiological monitor such as a heart rate monitor, a respiration monitor, a GPS system (including GPS watches), and/or the like. In some embodiments, the device 200 can include one or more sensors to sense fitness data associated with a user of the device. The device 200 includes a housing 210, a power source/battery 220, and at least one powered component, such as the illustrated electronic circuit 230 (e.g., a PCB). It is understood, however, that any other powered component can be envisioned in addition/alternative to the electronic circuit 230.

The housing 210 can be formed from any suitable electrically conductive medium/material. In some embodiments, the housing 210 can include a single continuous component. In some embodiments, the housing 210 can include multiple conductive components, and further include insulating components in between the conductive components. For example, the housing 210 can include dielectric material formed between two conducting portions. In some embodiments, the housing 210 can include two or more conductive components that form an upper portion and a lower portion such as the conductive components/portions 210A, 210B as illustrated in FIG. 2. In some embodiments, the electronic circuit 230 is electrically insulated from one portion of the housing, in this example portion 210A, but is conductively coupled to the second portion of the housing, in this example portion 210B as described herein. In some embodiments, device 200 can include an insulating layer 270 formed and/or positioned between the power source 220 and the housing 210, such as between the portion 210B and the power source 220. The insulating layer 270 includes apertures 250A-1, 250A-2, 250A-3, 250A-4 to enable conductive coupling of the housing 210 and the power source 230 via first apertures 250A-2, 250A-3 as well as the housing 210 and the electronic circuit 230 via second apertures 250A-1, 250A-4. In some embodiments, the first apertures 250A-2, 250A-3 can be continuous, e.g., forming a circular ring aperture in the insulating layer 270. In some embodiments, the second apertures 250A-1, 250A-4 can be continuous.

In some embodiments, the insulating layer can be formed using one or more insulating materials such as acrylic, ceramic, fiberglass, PVC etc. In other embodiments, the insulating layer can be one or more anodized layers of conductive materials such as aluminum. In some embodiments, one portion of the housing (e.g., the portion 210B) is removable, such as, for example, for purposes of removing/replacing the power source 220, making repairs to the electronic circuit 230, and/or the like. In some embodiments, the housing 210 is configured to receive user input (e.g., the portion 210A), as described in the '677 and '195 applications.

The power source 220 is illustrated in FIG. 2 as a coin cell, though any suitable power source can be employed. The power source 220 includes at least a first electrical contact 220A (shown in FIG. 2 as a negative terminal) formed relatively closer/being proximal to the electronic circuit 230, and a second electrical contact 220B (shown in FIG. 2 as a positive terminal) formed relatively closer to a side 260 of the housing 210, or being relatively distal to the electronic circuit 230). In some embodiments, substantially the entire surface area of the second electrical contact 220B can be in contact with and/or abut against the insulating layer 270. Since no gap is required between the second electrical contact 220B of the power source 220 and the side 260 for electrical connectivity, the device 200 can achieve a relatively smaller form factor than that illustrated in FIG. 1.

The second electrical contact 220B is in electrical communication with the housing 210 through raised portions 240A-2, 240A-3. In some embodiments, the raised portions 240A-2240A-3 are integrally formed with the housing 210 or fixedly coupled to the housing 210, and positioned to protrude through the first apertures 250A-2, 250A-3 to maintain electrical contact between the side 260 and the power source 220. In some embodiments, the raised portions 240A-2, 240A-3 can be formed from flycut metal cover, such as aluminum, that is conductive. In some embodiments, the raised portions 240A-2, 240A-3 are electric connectors and/or any suitable connectors that enable electric coupling between the side 260 and the power source 220 via the first apertures 250A-2, 250A-3. The housing 210 is, in turn, in electrical communication with the electronic circuit 230 via connectors 240A-1, 240A-4 (sometimes also referred to as "second connectors"). In some embodiments, the connectors 240A-1, 240A-4 can be resilient electric connectors, such as pogo pins for example. In some embodiments, the connectors 240A-1, 240A-4 can be coupled to the housing 210 and the electronic circuit 230 via the second apertures 250A-1, 250A-4. In this manner, the conductivity of the housing 210 is exploited to provide connectivity between a distal terminal (i.e., the second electrical contact 220B) of the power source 220 and the electronic circuit 230.

As also illustrated in FIG. 2, the first electrical contact 220A of the power source 220, facing and/or being in proximity of the electronic circuit 230, is in electrical communication with the electronic circuit 230 via one or more connectors 240B (sometimes referred to as "first connectors"). In the embodiment illustrated in FIG. 2, the electronic circuit 230 is in electrical communication with the power source 220 via two connectors 240B. In some embodiments, the contacts 240B are resilient electric connectors that can be mounted on the electronic circuit using surface mount technology (SMT). In this manner, the use of the raised portions 240A-2, 240A-3; the connectors 240A-1, 240A-4; and the connector(s) 240B, results in complete electrical connectivity between the power source 220 and the electronic circuit 230 without the use of a relatively larger and separate contact for the positive terminal (see. FIG. 1), thereby obtaining a smaller form factor. Further, the use of multiple contacts not only between the battery 220 and the housing 210 (i.e., the raised portions 240A-2, 240A-3), but also between the housing 210 and the electronic circuit 230 (i.e., the connectors 240A-1, 240A-4) ensures redundancy of connectivity, and reduces the likelihood of contact failure without increasing form factor.

In some embodiments, the connectors 240A-1, 240A-4 between the electronic circuit 230 and the housing 210 are configured to ground the housing. In this manner, when the housing 210 is configured to receive user input (example, via portion 210A), such as when the housing operates as a touch sensor (see the '677 and '195 applications), the electronic circuit 230 serves as an electrical ground for the housing 210, thereby obviating the need for a separate ground. As a result, form factor of the device 200 is relatively reduced.

In some embodiments, the area of contact between the second electrical contacts 220B and the insulating layer 270 is about 15 mm$^2$, about 20 mm$^2$, about 50 mm$^2$, about 100 mm$^2$, about 200 mm$^2$, about 300 mm$^2$, about 400 mm$^2$, about 450 mm$^2$, about 500 mm$^2$, including all values and sub ranges in between. In some embodiments, the connector(s) 240B are formed with, or connected to, the electronic circuit 230. In some embodiments, during use, when one or more of the raised portions 240A-2, 240A-3, and the connector 240B interfaces with the power source 220 (e.g., when a battery is installed and/or replaced), one or more actions can be triggered by the electronic circuit 230 and/or other processing components of the device 200. For example, an internal system check can be performed, an indication of battery power can be transmitted by the device 200 (e.g., to a second device, such as a Smartphone), and/or the like. In some embodiments, the raised portions 240A-2, 240A-3 and/or the connector(s) 240B can be independently formed and can include one or more conductive elements. In some embodiments any of the connectors disclosed herein can include multiple conductive elements that are fused, linked and/or otherwise in electrical communication with each other to provide a conduction path between the power supply 220 and the side 260 of the housing 210, as well as between the electronic circuit 230 and the power source 220. Non-limiting examples of connectors can include wires, pogo pins, pogo pin cables, jumpers, board-to-board connectors, circuit board connectors, Amp connectors, FFC (flexible flat cable), FPC (flexible printed cable), board connectors, wire to board connectors, ribbon connectors, combinations thereof, and/or the like. In some embodiments, the connector(s) 240B are mounted onto the surface of the powered component/electronic circuit using surface-mount technology (SMT). In some embodiments, the connector(s) 240B are resilient connectors such as spring clips configured to hold the power source 220 in a press fit against the insulating layer 270. In some embodiments, the connectors 240A-1, 240A-4 are resilient connectors, such as spring clips for example, configured to maintain conductive coupling between the electronic circuit 230 and the side 260 of the housing 210.

In some embodiments, the connectors 240A-1, 240A-4 are formed with or connected to the electronic circuit 230, while in other embodiments, the connectors 240A-1, 240A-4 are formed with or connected to the housing 210. In some embodiments, during use, when the contacts 240A-1, 240A-4 interface with the power source 220 (e.g., when a battery is installed and/or replaced), one or more actions can be triggered by the electronic circuit 230 and/or other processing components of the device 200.

Figure 3:
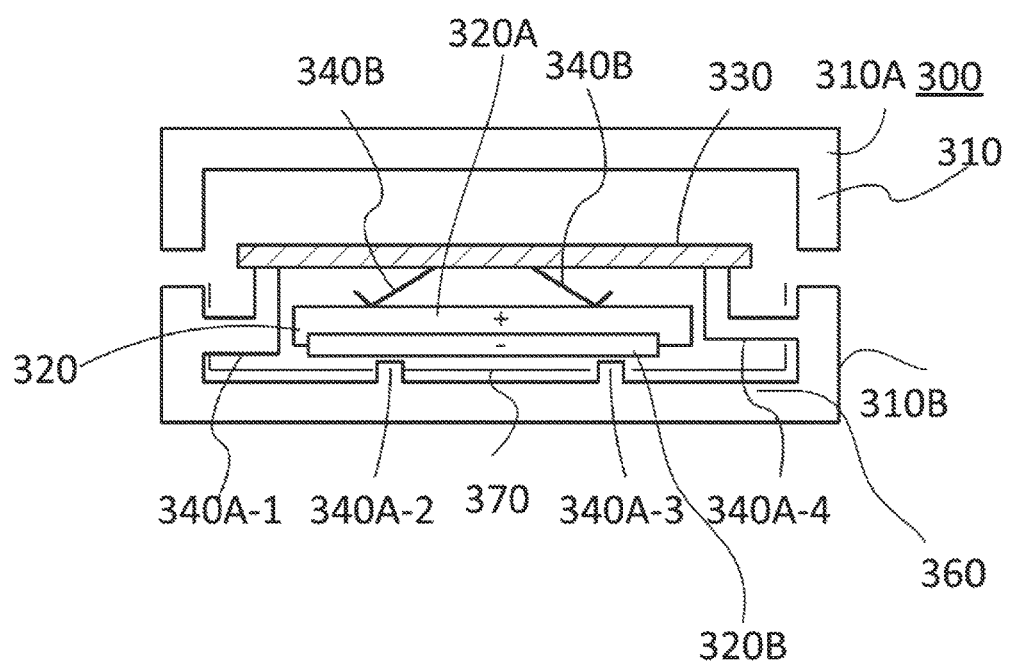
FIG. 3 also illustrates electrical connectivity using the housing of the device, according to other embodiments.

FIG. 3 is a schematic illustration of a device 300 that can be structurally and/or functionally similar to the device 200 as shown in FIG. 2, according to some embodiments. In the device 300, the polarities of the first electrical contact 320A and 320B are reversed relative to FIG. 2, such that the positive terminal/first electrical contact 320A is proximal to the electronic circuit 330, and the negative terminal/second electrical contact 320B is distal to the electronic circuit 330 and faces the housing 310. Components of the device 300 can be structured and have similar functionality to similarly named and referenced components of FIG. 2. For example, the connectors 340A-1, 340A-4 and can structurally/functionally similar to the connectors 240A-1, 240A-4, the insulating layer 370 can be structurally/functionally similar to the insulating layer 270, and/or the like.

Figure 4:
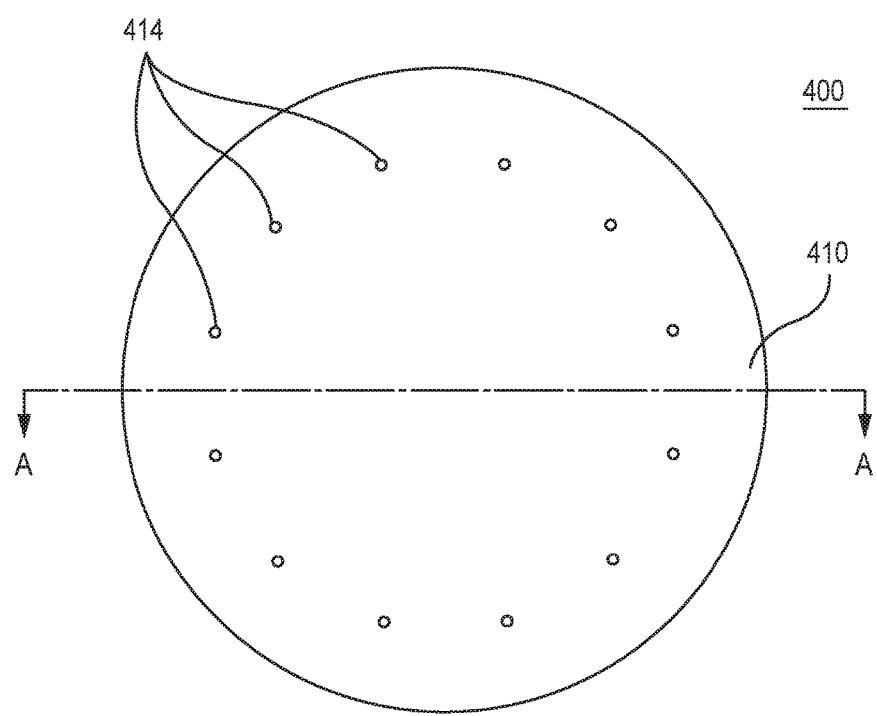
FIG. 4 is an illustration of the top view of an example device.

FIG. 4 is an illustration of the top view of a device 400 that can be functionally and/or structurally similar to the device 200 and/or the device 300. The device 400 includes a housing 410. The housing can be constructed from any suitable conductive material such as, but not limited to, stainless steel, aluminum, copper, conductive polymers, composites that include conductive additives (e.g., graphene), conductor-coated glass (e.g., with indium-tin-oxide, similar to capacitive touch screens), combinations thereof, and/or the like. In some embodiments, the housing 410 can be designed as a saucer-shaped structure having a convex surface.

In some embodiments, one surface of the housing 410 can include power consuming components 414 such as LED devices, sensors, combinations thereof, and/or the like. In some embodiments, the power consuming components 414 on the surface of the housing 410 can transmit and/or communicate an indication of fitness data associated with a user of the device to at least one processor and/or at least one electronic circuit included within the device 400 that can be similar to, for example, the electronic circuit 230 and/or the electronic circuit 330.

Figure 5:
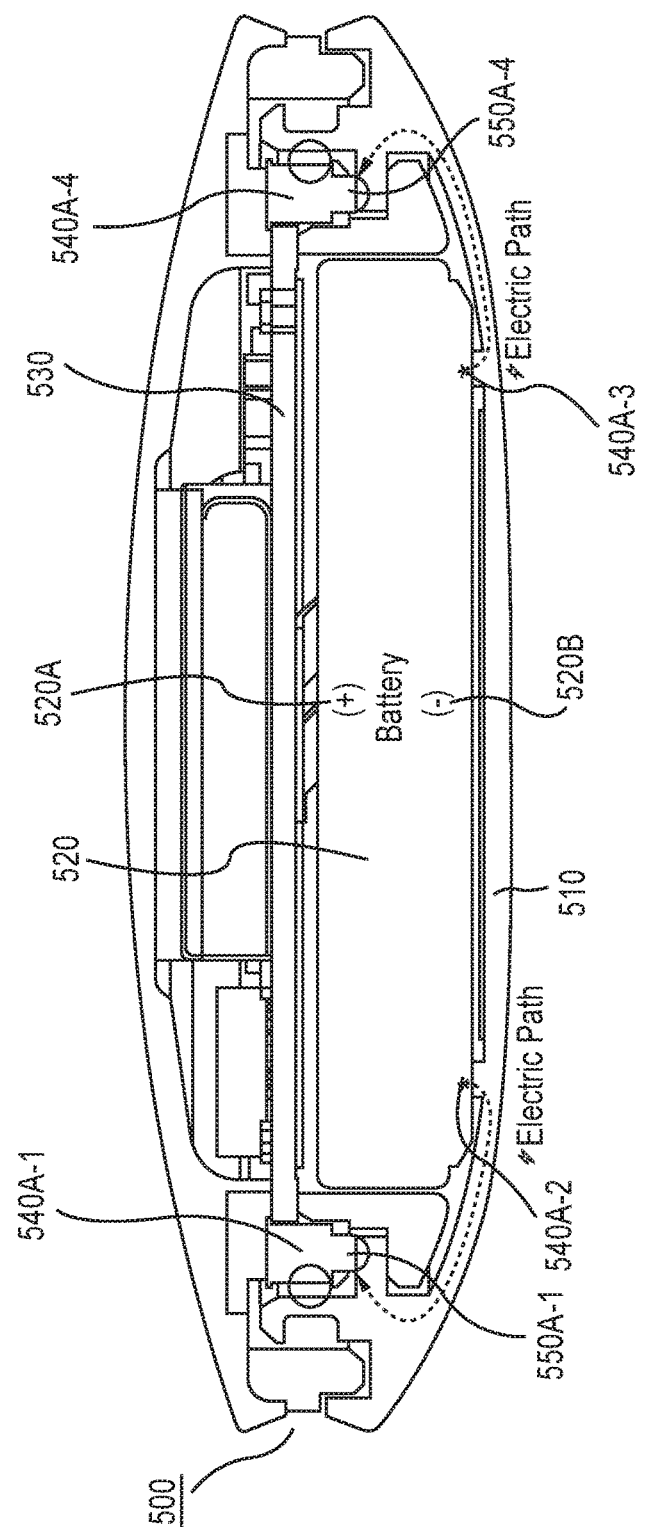
FIG. 5 shows a front sectional view of the device of FIG. 4 taken along the line A-A, and illustrates electrical connectivity with a first electrical contact of the power source, according to some embodiments.
Figure 8:
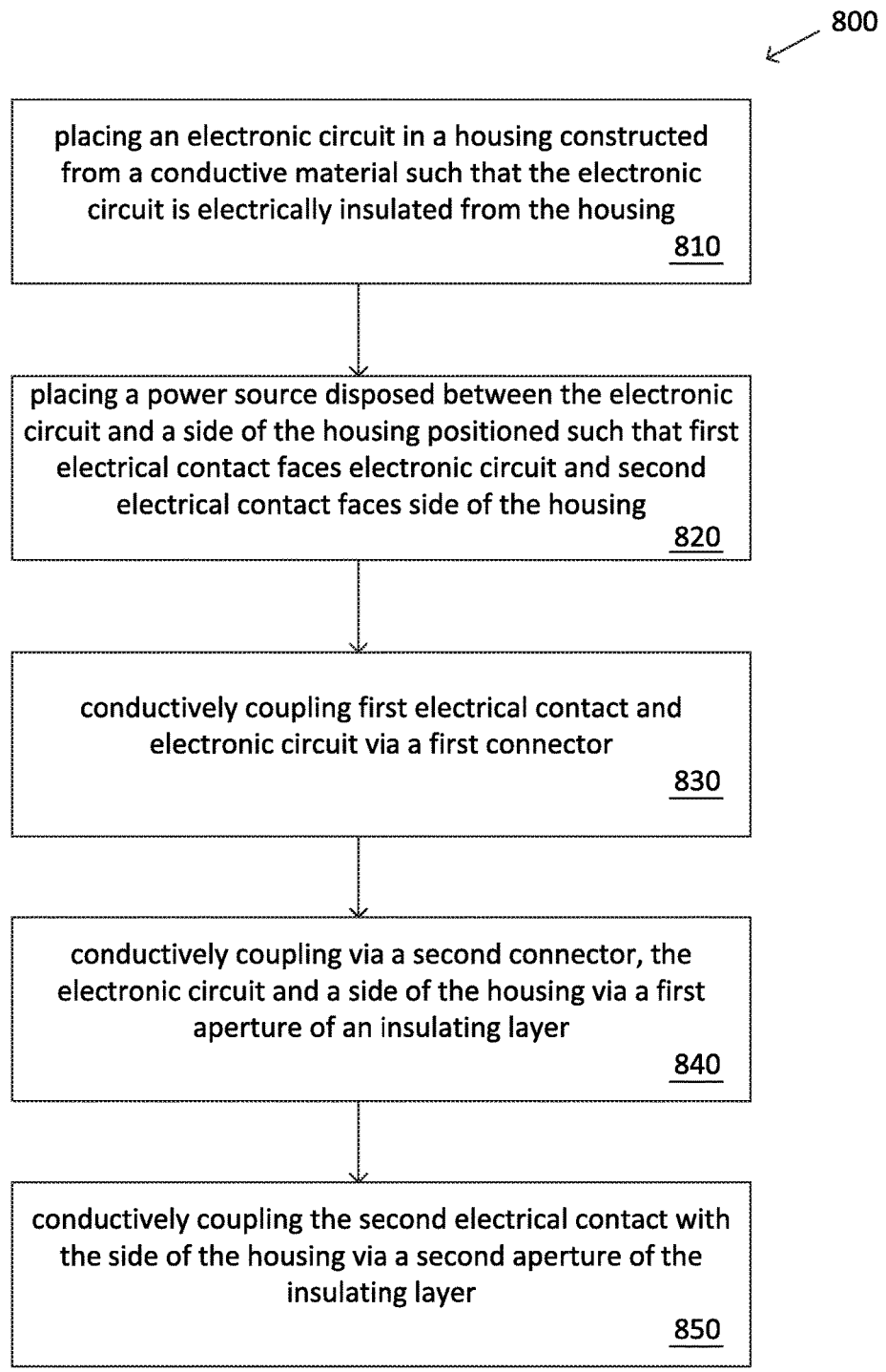
FIG. 8 is a flowchart illustrating a method, according to an embodiment.

FIG. 5 is a section-view of the device 400 along the section A-A and depicting current flow from a negative terminal 520B of a battery 520 within these embodiments. In such embodiments, the negative terminal 520B can be electrically coupled to the housing 510 via raised portions 540A-2, 540A-3. The raised portions 540A-2, 540A-3 are formed as a continuous portion, as best illustrated in FIG. 8 (described later). Additionally, the housing 510 is coupled to electronic circuit 530 via the connectors 540A-1, 540A-4, such as via pogo-pins as illustrated. In some embodiments, the connectors 540A-1, 540A-4 are coupled to the housing 510 via apertures 550A-1, 550A-2 formed in a thin insulating layer (not indicated in FIG. 5). The connectors 540A-1, 540A-4 are electrically connected to the electronic circuit 530.

In some embodiments, any of the raised portions 540A-2, 540A-3, and/or the connectors 540A-1, 540A-4 can be flycut surfaces of any suitable conductive material. In some embodiments, these flycut surfaces are obtained by removing anodization from the insulating layer within the housing 510 forming apertures within the insulating layer. In other embodiments, any of the raised portions 540A-2, 540A-3, and/or the connectors 540A-1, 540A-4 can be obtained at least in part by flycutting conductive metals such as copper, aluminum and/or stainless steel and mechanically coupling the surfaces to the housing 510. The connectors 540A-1, 540A-4 can be any suitable conductive material and, in some example embodiments, can be mounted onto the electronic circuit 530 using surface-mount technology (SMT).

During use, the negative terminal 520B of the battery 520 is connected and/or electrically coupled to, the raised portions 540A-2 and 540A-3. Charge travels from the raised portions 540A-2, 540A-3 through the housing 510 to the connectors 540A-1, 540A-2 as illustrated in FIG. 5. Thus, the conductivity of the housing 510 is exploited to provide connectivity between the negative terminal 520B of the battery 520 and the electronic circuit 530.

Figure 6:
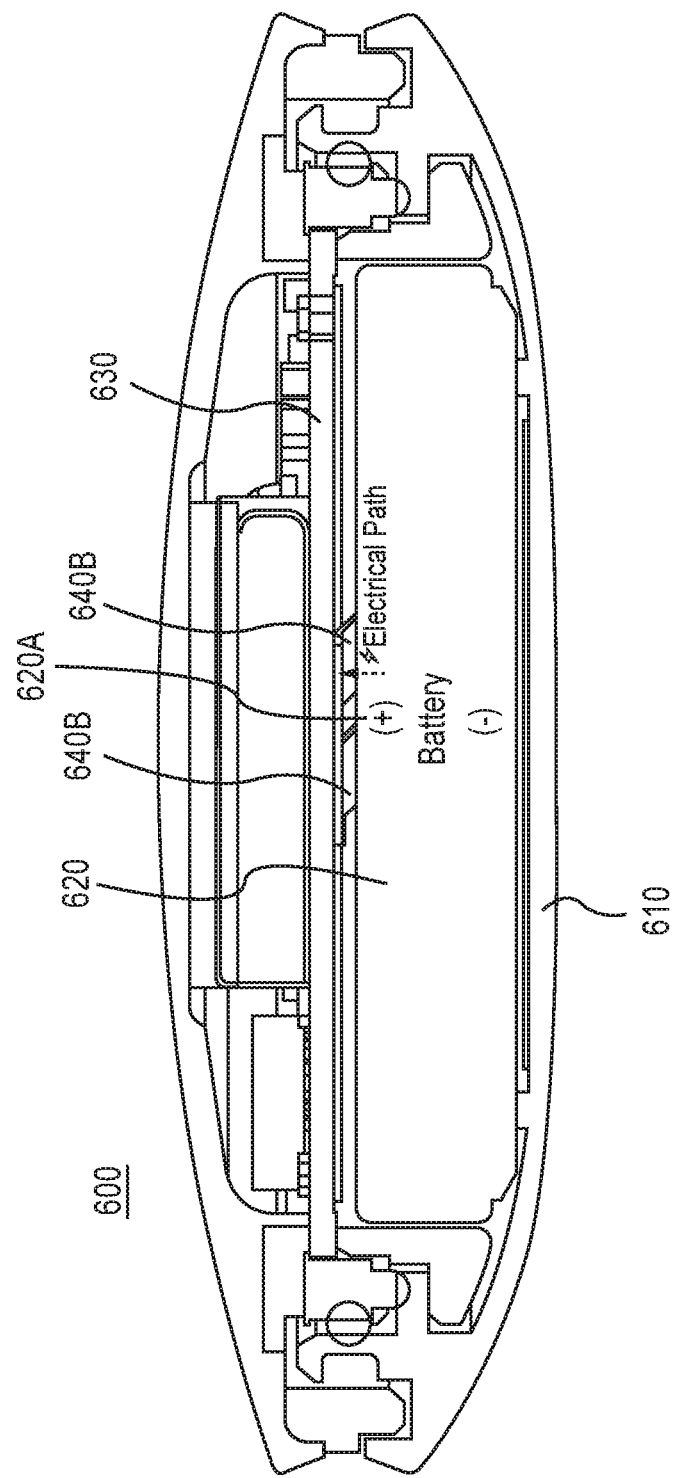
FIG. 6 shows a front sectional view of the device of FIG. 4 taken along the line A-A, and illustrates electrical connectivity with a second electrical contact of the power source, according to some embodiments.

FIG. 6 is a section-view of the device 400 along the section A-A and depicting current flow from the positive terminal 620A of the battery 620 to an electronic circuit 630, according to embodiments. In this embodiment, the positive terminal 620A of the battery 620 is in contact with the electronic circuit 630 via contact(s) 640B. In some embodiments, the contact(s) 640B are electric connectors/connectors such as wires, pogo pins, pogo pin cables, jumpers, board-to-board connectors, circuit board connectors, Amp connectors, FFC (flexible flat cable) I FPC (flexible printed cable) board connectors, wire to board connectors, ribbon connectors, combinations thereof, and/or the like. When the device 600 is powered, electric current flows from the positive terminal of the battery to the electronic circuit 630 via the connector(s) 640B.

Figure 7:
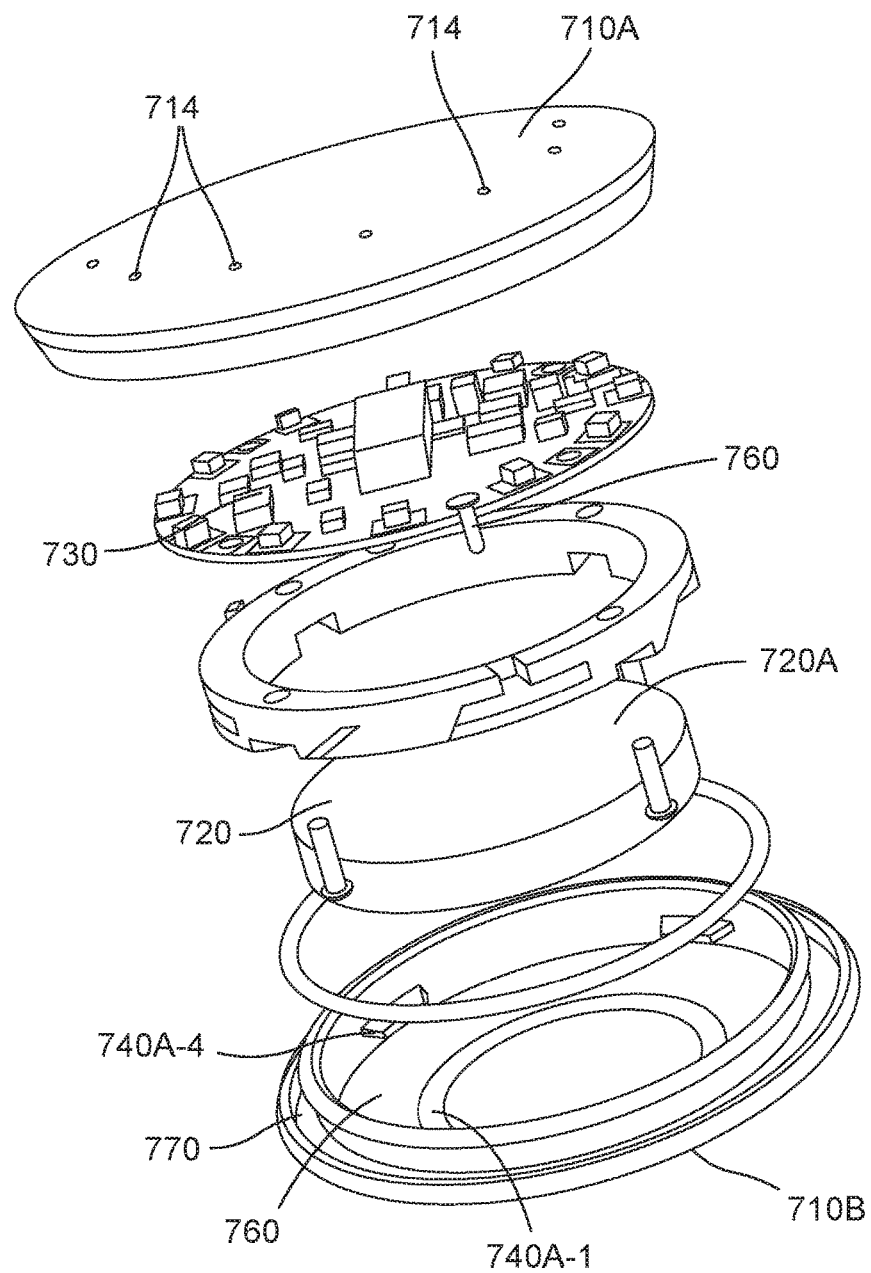
FIG. 7 is an exploded perspective view illustrating some components of the device of FIG. 4.

FIG. 7 is an illustration of the exploded view of some embodiments of the device 400 of FIG. 4, illustrated here as device 700. The device 700 includes a conductive housing 710 having an insulating layer 770 deposited herein. In some embodiments, the conductive housing 710 includes one or more components that form an upper portion 710A and a lower portion 710B as illustrated in FIG. 7. The housing 710 is electrically coupled to a power source/battery 720 via flycut faces 780A and 780B (collectively 780). The housing 710 is in electronic communication with an electronic circuit 730 via one or more connectors 760, formed as a pogo pin. Additionally, a distal side/second electrical contact (not visible in current view) of the power source 720 is in electrical communication with the housing 710 via a raised portion 740A-1. The device 400, when powered is operable by a user for collecting fitness-related and/or other biometric information.

In some embodiments, the portion 710A of the housing can include a plurality of power consuming components 714 such as LED devices, sensors, combinations thereof, and/or the like. In some embodiments, the power consuming components 714 can transmit fitness data associated with a user of the device to at least one processor and/or at least one electronic circuit 730 included within the device 400.

As stated earlier, in some embodiments, the housing 710 includes one or more insulating layers 770 between the conductive components. In some embodiments, the insulating layer 770 can be one or more layers of anodized aluminum. In other embodiments, the insulating layer 770 can be a dielectric material formed between two conducting components. The insulating layer 770 can exist between conductive components such as battery 720 and a side of the housing 710B and/or between electronic circuit 730 and the housing 710.

A side 760 of the housing 710B is electrically coupled to a power source/battery 720 via raised portion 740A-1, shown here as a circular ring. The raised portion 740A-1 can be any suitable conductive metal such as aluminum. The housing 710 can include a raised portion 780B that is configured to, along with the connector 760, maintain electrical contact with the battery 720. The resilient connector 760, hold the battery 720 in a press fit against the insulating layer 770 during use and maintain electrical contact between the battery 720 and the housing 710.

In this example embodiment, the power source/battery 720 is a coin cell, though any suitable power source can be employed. The power source includes at least one negative terminal and at least one positive terminal. In some embodiments, the battery 720 can be replaced periodically as necessary. In other embodiments, the battery 720 can be recharged periodically and may not need replacement.

The device 400 can also includes one or more connectors (not visible in current view) between the contact 720A of battery 720 and the electronic circuit 730, e.g. similar to the connectors 240B and/or 340B. Each such connector can be independently formed, and include one or more conductive elements.

The electronic circuit 730 is illustrated in FIG. 7 to be in electrical communication with the housing 710 via a pogo pin 760. The pogo pin 760 can include multiple conductive elements that are fused, linked, and/or otherwise in electrical communication with each other to provide a conduction path between the battery 720 and the electronic circuit 730. In some embodiments, the pogo pin 760 is mounted onto the surface of the electronic circuit 730 using surface-mount technology (SMT).

FIG. 8 illustrates a method 800, according to an embodiment. In some embodiments, the method 800 is useful for constructing and/or assembling any of the devices 200, 300, 400, 500, 600, and/or 700 disclosed herein. The method 800 includes, at 810, placing an electronic circuit (e.g., the circuit 230 in FIG. 2) in a housing (e.g., the housing 210 in FIG. 2) that is constructed from a conductive material. The electronic circuit is electrically insulated from the housing. At 820, a power source (e.g., 220 in FIG. 2) is placed between the electronic circuit and a side of the housing (e.g., the side 260 in FIG. 2). The power source is positioned such that a first electrical contact of the power source faces the electronic circuit and a second electrical contact of the power source faces the side of the housing. At 830, the electronic circuit and the first electrical contact of the power source are conductively coupled via a first connector (e.g., the connector 240B in FIG. 2). At 840, the electronic circuit is conductively coupled via a second connector (e.g., one or more of the connectors 240A-1, 240A-4 in FIG. 2) to the side of the housing via at least one aperture (e.g., one or more of the apertures 250A-1, 250A-4) of an insulating layer (e.g., 270 in FIG. 2) on the side of the housing. At 850, the second electrical contact is conductively coupled with the side of the housing via a second aperture (e.g., one or more of the apertures 250A-2, 250A-3 in FIG. 2) of the insulating layer. The second electrical contact is conductively coupled to the electronic circuit via the housing and the second connector. In some embodiments, the entire surface area of the second electrical contact is in contact with the insulating layer, which in turn helps reduce form factor.

In some embodiments, the first connector includes a resilient connector such as spring clips. In some embodiment, the method 800 further includes positing the power source between the resilient connector and the insulating layer such that the power source is in a press fit against the insulating layer. In some embodiments, one of the first electrical contact and the second electrical contact of the power source is a positive terminal and the other of the first electrical contact and the second electrical contact of the power source is a negative terminal. In some embodiments, the power source is positioned such that the positive terminal faces the electronic circuit. In other embodiments, the power source is positioned such that the negative terminal faces the electronic circuit.

In some embodiments, the insulating layer can be an anodized layer. In some embodiments, the method further includes electrically coupling the second connector to the electronic circuit via a surface mount technology (SMT).

In this manner, the conductive housing of the device offers several benefits. The conductive housings as battery contacts complete the circuit and reduces form factor. Multiple electric interconnectors/contacts between the battery and the housing, and also the housing and the PCB ensure redundancy of connectivity, and reduce the likelihood of contact failure without increasing form factor.

Any of the devices 200, 300, 400, 500, 600, 700 can be in communication with other devices (not shown) via a communication link (not shown) and/or via a network. Described hereon with reference to the device 200 for simplicity, the communication link can be any suitable means for wireless communication between the device 200 and other devices, including capacitive, magnetic, optical, acoustic, and/or the like. The communication link can include bidirectional communication and, in some embodiments, any or all communications may be secured (e.g., encrypted) or unsecured, as suitable and as is known in the art.

Some embodiments described herein can relate to a kit including the device 200. In some embodiments, the kit can include one or more holders for the device 200. As an example, a kit can include the device 200, and further include one or more accessories for holding the device such as a necklace, a wrist strap, a belt, a clip, a clasp, and/or the like.

Some embodiments described herein relate to a computer storage product with a non-transitory computer-readable medium (also referred to as a non-transitory processor-readable medium) having instructions or computer code thereon for performing various computer-implemented operations. The computer-readable medium (or processor-readable medium) is non-transitory in the sense that it does not include transitory propagating signals (e.g., a propagating electromagnetic wave carrying information on a transmission medium such as space or a cable). The media and computer code (also referred to herein as code) may be those designed and constructed for the specific purpose or purposes. Examples of non-transitory computer-readable media include, but are not limited to: flash memory, magnetic storage media such as hard disks, optical storage media such as Compact Disc/Digital Video Discs (CD/DVDs), Compact Disc-Read Only Memories (CD-ROMs), magneto-optical storage media such as optical disks, carrier wave signal processing modules, and hardware devices that are specially configured to store and execute program code, such as Application-Specific Integrated Circuits (ASICs), Programmable Logic Devices (PLDs), Read-Only Memory (ROM) and Random-Access Memory (RAM) devices.

Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using Java, C++, or other programming languages and/or other development tools.

Where methods and/or schematics described above indicate certain events and/or flow patterns occurring in certain order, the ordering of certain events and/or flow patterns may be modified. Additionally certain events may be performed concurrently in parallel processes when possible, as well as performed sequentially.

The invention claimed is:

1. A device, comprising:
a housing constructed from a conductive material;
an electronic circuit electrically insulated from the housing;
a power source disposed between the electronic circuit and a side of the housing, the power source positioned such that a first electrical contact of the power source faces the electronic circuit, and such that a second electrical contact of the power source faces the side of the housing;
an insulating layer disposed on the housing, the insulating layer including a first aperture and a second aperture formed therein;
a first connector configured for electrically coupling the electronic circuit and the first electrical contact; and
a second connector configured for electrically coupling the electronic circuit and the side of the housing via the first aperture of the insulating layer, the power source configured for electrically coupling the second electrical contact with the side of the housing via the second aperture of the insulating layer, such that the second electrical contact is conductively coupled to the electronic circuit via the housing and the second connector for complete electrical interconnection between the power source and the electronic circuit via the housing.

2. The device of claim 1, wherein the first connector includes a resilient connector configured to, during use, hold the power source in a press fit against the insulating layer.

3. The device of claim 1, wherein the second connector includes a resilient connector configured to maintain conductive coupling between the electronic circuit and the side of the housing.

4. The device of claim 1, wherein the power source is a coin cell, one of the first electrical contact and the second electrical contact is a positive terminal, and the other of the first electrical contact and the second electrical contact is a negative terminal.

5. The device of claim 1, wherein an area of contact between the second electrical contact and the insulating layer is in the range from about 15 mm$^2$ to about 500 mm$^2$.

6. The device of claim 1, wherein the entire surface area of the second electrical contact is in contact with the insulating layer.

7. The device of claim 1, wherein the side of the housing includes a raised portion positioned to protrude through the insulating layer and contact the second electrical contact.

8. The device of claim 1, wherein the second connector includes a plurality of second connectors.

9. The device of claim 1, wherein the insulating layer includes an anodized layer of the conductive material.

10. The device of claim 1, wherein the second connector is conductively coupled to the electronic circuit via a surface mounted technology (SMT) connector.

11. The device of claim 1, wherein the electronic circuit is configured to receive fitness data from one or more sensors, the fitness data associated with a user of the device.

12. The device of claim 1, wherein the second connector is configured to ground the housing.

13. A method, comprising:
disposing an electronic circuit in a housing, the housing constructed from a conductive material, the electronic circuit electrically insulated from the housing;
disposing a power source between the electronic circuit and a side of the housing, the power source positioned such that a first electrical contact of the power source faces the electronic circuit, and such that a second electrical contact of the power source faces the side of the housing;
electrically coupling the electronic circuit and the first electrical contact via a first connector;
electrically coupling, via a second connector, the electronic circuit and a side of the housing via a first aperture of an insulating layer on the side of the housing, the insulating layer including the first aperture and a second aperture formed therein; and
electrically coupling the second electrical contact with the side of the housing via the second aperture of the insulating layer, such that the second electrical contact is conductively coupled to the electronic circuit via the housing and the second connector for complete electrical interconnection between the power source and the electronic circuit via the housing,
wherein the entire surface area of the second electrical contact is in contact with the insulating layer.

14. The method of claim 13, wherein the first electrical contact includes a resilient connector, the placing the power source further including positioning the power source between the resilient connector and the insulating layer, such that the power source in a press fit against the insulating layer.

15. The method of claim 13, wherein one of the first electrical contact and the second electrical contact is a positive terminal and the other of the first electrical contact and the second electrical contact is a negative terminal, the placing the power source further including positioning the power source such that the positive terminal faces the electronic circuit.

16. The method of claim 13, wherein one of the first electrical contact and the second electrical contact is a positive terminal and the other of the first electrical contact and the second electrical contact is a negative terminal, the placing the power source further including positioning the power source such that the negative terminal faces the electronic circuit.

17. The method of claim 13, wherein the insulating layer is an anodized layer.

18. The method of claim 13, further comprising:
   electrically coupling, via a surface mounted technology (SMT) connector, the second connector to the electronic circuit.

* * * * *